US006645703B2

(12) United States Patent
Hatab et al.

(10) Patent No.: US 6,645,703 B2
(45) Date of Patent: Nov. 11, 2003

(54) METHODS OF PHOTO-PROCESSING PHOTORESIST

(75) Inventors: Ziad R. Hatab, Boise, ID (US); Paul D. Shirley, Meridian, ID (US); Tony C. Krauth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 295 days.

(21) Appl. No.: 09/894,194

(22) Filed: Jun. 27, 2001

(65) Prior Publication Data

US 2001/0038955 A1 Nov. 8, 2001

Related U.S. Application Data

(62) Division of application No. 09/420,336, filed on Oct. 18, 1999.

(51) Int. Cl.[7] .................................................. G03C 5/00
(52) U.S. Cl. ....................... 430/315; 430/312; 430/313; 430/330
(58) Field of Search ................................ 430/312, 313, 430/315, 330

(56) References Cited

U.S. PATENT DOCUMENTS

| 6,228,540 B1 | 5/2001 | Kobayashi |
| 6,228,544 B1 | 5/2001 | Ota |
| 6,482,552 B2 * | 11/2002 | Hatab et al. ................ 430/5 |

OTHER PUBLICATIONS

Abstract and other information on Jap. Pat. 60–246632, "Method for Reduced Projection and Exposure for Photoelectric Image and System Therefor", published Dec. 6, 1985, 2 pgs.
Abstract and other information on Jap. Pat. 09–275070, "Aligner", published Oct. 21, 1997, 2 pgs.
Abstract and other information on Jap. Pat. 02–302757, "Pellicle Having Cooling Function", published Dec. 14, 1990, 1 pg.
Abstract and other information on Jap. Pat. 01–251612, "Apparatus for Cooling Reticle Mask", published Oct. 6, 1989, 1 pg.
Abstract and other information on Jap. Pat. 10–289874, "Aligner", published Oct. 27, 1998, 1 pg.
Abstract and other information on Jap. Pat. 06–260387, "Stepper", published Sep. 16, 1994, 2 pgs.

* cited by examiner

Primary Examiner—Mark F. Huff
Assistant Examiner—Saleha R. Mohamedulla
(74) Attorney, Agent, or Firm—Wells St. John P.S.

(57) ABSTRACT

The invention encompasses a method of forming photoresist on a semiconductor wafer. A wafer is coated with a first layer of photoresist to define a first photoresist-coated wafer. The first photoresist-coated wafer is placed on a temperature-regulated mass and thermally equilibrated to a temperature. Subsequently, the first photoresist-coated wafer is photo-processed. After the photo-processing, the wafer is coated with a second layer of photoresist to define a second photoresist-coated wafer. The second photoresist-coated wafer is placed on the temperature-regulated mass and thermally equilibrated to the same temperature that the first photoresist-coated wafer had been equilibrated to. Subsequently, the second layer of photoresist is photo-processed. The invention also encompasses a reticle forming method. A layer of masking material is formed over a reticle substrate, and the reticle substrate is then placed on a temperature-regulated mass. The masking material is exposed to a patterning beam while the reticle is on the temperature-regulated mass, and the temperature-regulated mass holds the temperature of the reticle substrate about constant during such exposing.

11 Claims, 6 Drawing Sheets

METHODS OF PHOTO-PROCESSING PHOTORESIST

RELATED PATENT DATA

This patent resulted from a divisional of U.S. patent application Ser. No. 09/420,336, which was filed on Oct. 18, 1999.

TECHNICAL FIELD

The invention pertains to methods of forming photoresist on semiconductor wafers, as well as to reticle forming methods.

BACKGROUND OF THE INVENTION

Photolithography is frequently utilized in modern semiconductor component fabrication. In photolithography, a reticle is formed and utilized to pattern light. The patterned light is impacted on photoresist to selectively expose some portions of the resist to the light, while leaving other portions not exposed. The photoresist is then exposed to a solvent which selectively removes either the exposed or unexposed portions to accordingly pattern the layer of photoresist.

Difficulties in semiconductor wafer fabrication can occur in forming a reticle. Reticles are typically formed by providing a layer of photoresist over a quartz substrate, and subsequently exposing portions of the photoresist to a beam of radiation while leaving other portions not exposed. The beam of radiation can be, for example, either a laser beam or an electron beam. The beam is moved slowly across an entirety of a surface of the photoresist to pattern the photoresist. Such process can take about eight hours for a laser etch, or about 24 hours for an electron beam etch. Electron beam etching is generally more precise than laser etching. However, due to the long exposure time of electron beam etching, it is often found that regions of the wafer which were initially exposed to an electron beam will process differently than portions exposed later through the electron beam. Accordingly, laser beam etching will cause non-uniformity across a reticle surface. Even with the relatively short exposure times of a laser etch, there can be non-uniformity across a reticle surface. However, such non-uniformity is generally less than that which occurs with electron beam etching.

After the photoresist is exposed to either the laser etch or the electron beam etch, it is subjected to a solvent which selectively removes either the portion of the photoresist exposed to the radiation, or the portion not exposed, to pattern the photoresist. The patterned photoresist is then subsequently used as a mask during an etch of the underlying reticle substrate, to ultimately form a patterned reticle from the substrate.

It would be desirable to develop methods which improve the uniformity of radiation patterning of a photoresist during reticle fabrication.

Difficulties can also occur during the formation and processing of photoresist on semiconductor wafers during formation of integrated circuitry. For instance, multiple layers of patterned photoresist can be utilized in fabrication of semiconductor circuitry on a wafer. Typically, a separate patterned layer of photoresist will be utilized for forming each layer of circuitry. It is important that each subsequent layer of photoresist be aligned exactly with the preceding layers of photoresist so that the respective layers of circuitry are appropriately aligned with one another. Occasionally, subsequent layers of photoresist do not align with preceding layers of photoresist, and such can render circuitry formed on the wafer to be inoperable. It would accordingly be desirable to develop methods which reduce a risk of misalignment of subsequent photoresist layers relative to preceding photoresist layers.

SUMMARY OF THE INVENTION

In one aspect, the invention encompasses a method of forming photoresist on a semiconductor wafer. A wafer is coated with a first layer of photoresist to define a first photoresist-coated wafer. The first photoresist-coated wafer is placed on a temperature-regulated mass and thermally equilibrated to a temperature. Subsequently, the first photoresist-coated wafer is photo-processed. After the photo-processing, the wafer is coated with a second layer of photoresist to define a second photoresist-coated wafer. The second photoresist-coated wafer is placed on the temperature-regulated mass and thermally equilibrated to the same temperature that the first photoresist-coated wafer had been equilibrated to. Subsequently, the second layer of photoresist is photo-processed.

In another aspect, the invention encompasses a reticle forming method. A layer of masking material is formed over a reticle substrate, and the reticle substrate is then placed on a temperature-regulated mass. The masking material is exposed to a patterning beam while the reticle is on the temperature-regulated mass, and the temperature-regulated mass holds the temperature of the reticle substrate about constant during such exposing.

BRIEF DESCRIPTION OF THE DRAWINGS

Preferred embodiments of the invention are described below with reference to the following accompanying drawings.

FIG. 1 shows a wafer within the apparatus and at an initial step of a process of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
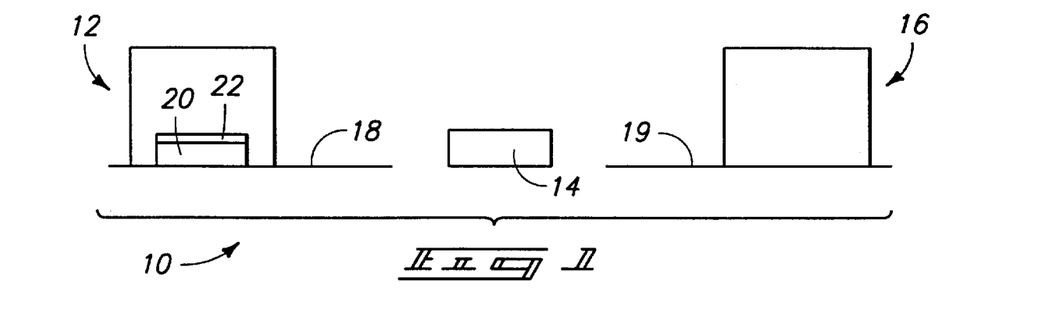
FIG. 1 is a diagrammatic, cross-sectional, side view of an apparatus of the present invention configured to form photoresist on a wafer and subsequently photo-process the photoresist.

FIGS. 1–5 diagrammatically illustrate a wafer processing assembly 10 utilized in accordance with a method of the present invention. Referring to FIG. 1, wafer processing assembly 10 comprises a station 12 configured for forming a photoresist coating on a semiconductor wafer; a temperature-regulated mass 14; and a station 16 configured to expose the semiconductive wafer to a patterned beam of radiation (station 16 can comprise, for example, a stepper).

A first track 18 is provided proximate station 12, and is configured to transport semiconductor wafers into and out of station 12. A second track 19 is provided proximate station 16, and configured to transport semiconductor wafers into and out of station 16.

A semiconductor wafer 20 is shown within station 12, and a photoresist layer 22 is shown over wafer 20. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
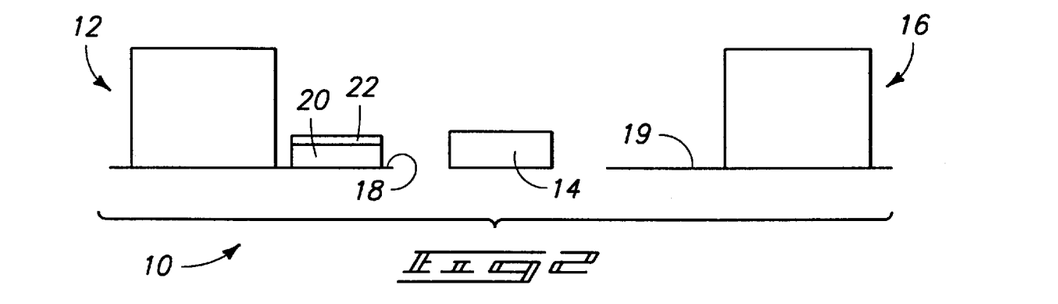
FIG. 2 is a view of the FIG. 1 apparatus showing the wafer at a processing step subsequent to that of FIG. 1.

Referring to FIG. 2, wafer 20 is shown transported out of station 12 and along track 18.

Figure 3:
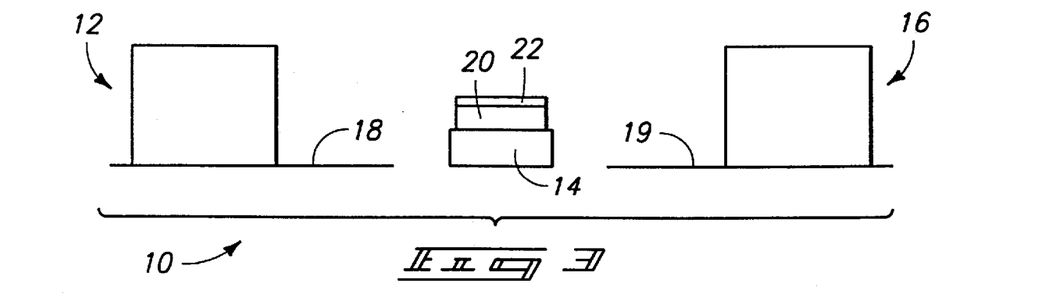
FIG. 3 is a view of the FIG. 1 apparatus showing the wafer at a processing step subsequent to that of FIG. 2.

Referring to FIG. 3, wafer 20 has been transported onto temperature-regulated mass 14. Wafer 20 can be transported from track 18 to mass 14 by, for example, a robotic arm (not shown). Wafer 20 is retained on mass 14 for a sufficient period of time to equilibrate wafer 20 to a temperature of the mass. Preferably, mass 14 is maintained at a temperature similar to a temperature of a wafer exiting station 12, which can reduce a time for temperature equilibration of the wafer relative to the time it would take if mass 14 were at a temperature significantly different than a temperature of a wafer exiting station 12. Wafers typically exit photoresist coating stations at temperatures approximating room temperature (i.e., temperatures of between 20 and 24° C.). Accordingly, the temperature of mass 14 is preferably from about 10° C. to about 30° C., more preferably from about 18° C. to about 24° C., and even more preferably from about 21° C. to about 23° C. Temperature-regulated mass 14 is held within 0.1° C. of a desired temperature and maintained within 0.1° of the desired temperature for at least a sufficient period of time for wafer 20 to be fully equilibrated to the desired temperature. To aid in interpretation of the specification and the claims that follow, it is to be understood that when a wafer is referred to as being equilibrated to a temperature it is meant that an entirety of the wafer is within 0.1° C. of such temperature when the temperature is expressed in degrees Centigrade. The temperature of temperature-regulated mass 14 can be controlled by, for example, a fluid or thermal electrical mechanisms. An exemplary temperature-regulated mass having the temperature controlled by fluid is described below with reference to FIG. 17.

Figure 4:
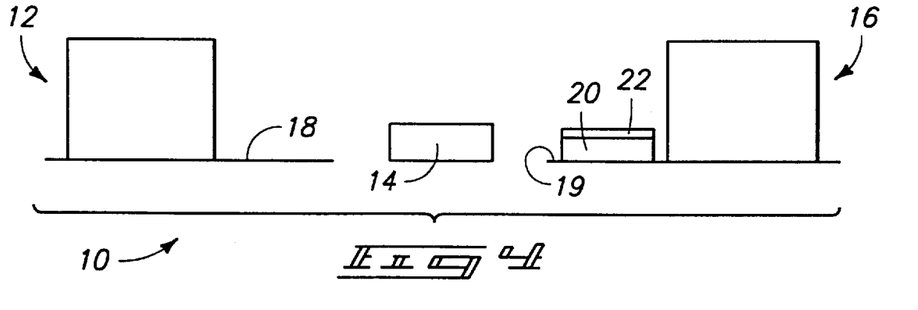
FIG. 4 is a view of the FIG. 1 apparatus showing the wafer at a processing step subsequent to that of FIG. 3.

Referring to FIG. 4, wafer 20 is transported from mass 14 onto track 19 after the wafer has thermally equilibrated to the desired temperature. Such transfer can be accomplished by, for example, a robotic arm, and, in particular embodiments of the invention, can utilize the same robotic arm as used for transporting wafer 20 from track 18 to mass 14.

Figure 5:
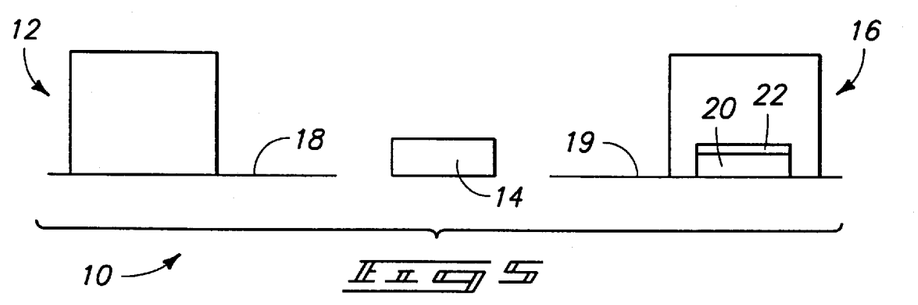
FIG. 5 is a view of the FIG. 1 apparatus showing the wafer at a processing step subsequent to that of FIG. 4.

Referring to FIG. 5, wafer 20 is shown after being transferred along track 19 and into station 16. While in station 16, photoresist layer 22 can be exposed to a patterned beam of light and accordingly photo-processed to form a pattern of exposed and unexposed regions of the photoresist. In subsequent processing (not shown) the photoresist can be exposed to a solvent which selectively removes either the patterned or unpatterned portions, and which accordingly forms a patterned mask from the photoresist.

It is noted that stations 12 and 16 of FIGS. 1–5 can comprise conventional equipment utilized in the provision and patterning of photoresist. It is further noted that although temperature-regulated mass 14 is shown as remaining stationary between stations 12 and 16, in other embodiments of the invention (not shown), a continuous belt can extend between stations 12 and 16 and mass 14 can travel along such belt between stations 12 and 16. Further in such embodiments, semiconductive material wafer 20 can remain over mass 14 while the wafer is in station 12, and continuously as the wafer is transferred from station 12 to station 16, as well as while the wafer is photo-processed in station 16.

An advantage of utilizing the processing of FIGS. 1–5 is that a temperature of a wafer can be equilibrated to a desired temperature prior to photo-processing of the wafer. In one aspect of the invention, it is recognized that mask misalignment problems can occur if semiconductor wafers are not equilibrated to the same temperature during photo-processing of different layers of photoresist. It is further recognized that the actual temperature to which the wafers are equilibrated can be any temperature in the range from 10° C. to 30° C., provided that the wafer is always equilibrated to the same temperature within such range as each subsequent layer of photoresist is patterned. Such aspect of the invention is more fully explained with reference to FIGS. 6–13. In referring to FIGS. 6–13, similar numbering will be utilized as was used above in describing FIGS. 1–5.

Figure 6:
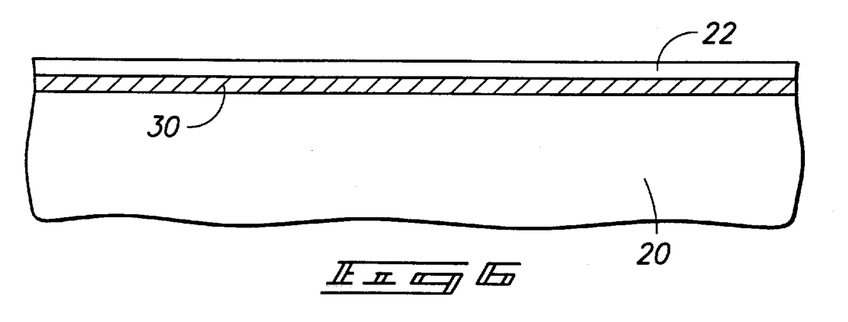
FIG. 6 is a diagrammatic, cross-sectional side view of a wafer processed according to a method of the present invention.

FIG. 6 shows semiconductive material wafer 20 having a first photoresist layer 22 thereover, and at a processing step prior to photo-processing. FIG. 6 also shows a conductive material 30 between photoresist 22 and wafer 20, with conductive material 30 ultimately to be configured into a first layer of circuitry over wafer 20. Wafer 20 of FIG. 6 is shown after the photoresist formation occurring at station 12 (FIG. 1). Wafer 20 of FIG. 6 is equilibrated to within 0.1° C. of a desired temperature from 10° C. to 30° C. (preferably utilizing a thermally equilibrated mass, such as, for example, mass 14 of FIG. 3). An exemplary desired temperature can be 22° C. Wafer 20 of FIG. 6 can be referred to herein as a first photoresist coated wafer to distinguish the photoresist coating of FIG. 6 from a second photoresist coating that will be described below.

Figure 7:
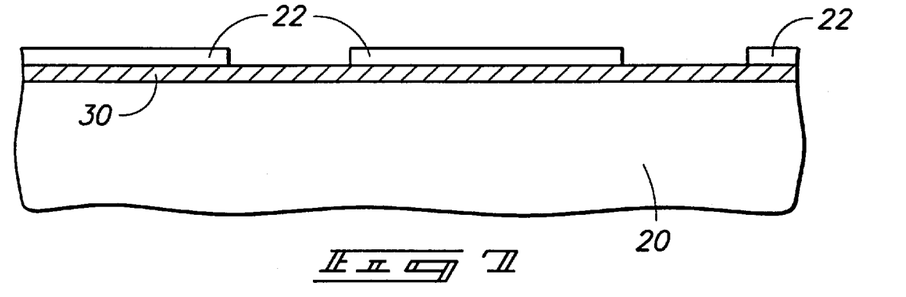
FIG. 7 is a view of the FIG. 6 wafer shown at a processing step subsequent to that of FIG. 6.

Referring to FIG. 7, wafer fragment 20 is shown after photo-processing (i.e., after processing in station 16 of FIG. 5), and after photoresist 22 has been exposed to a solvent which selectively removes either the portions of photoresist layer 22 that were exposed to light, or the portions that were not exposed to light.

Figure 8:
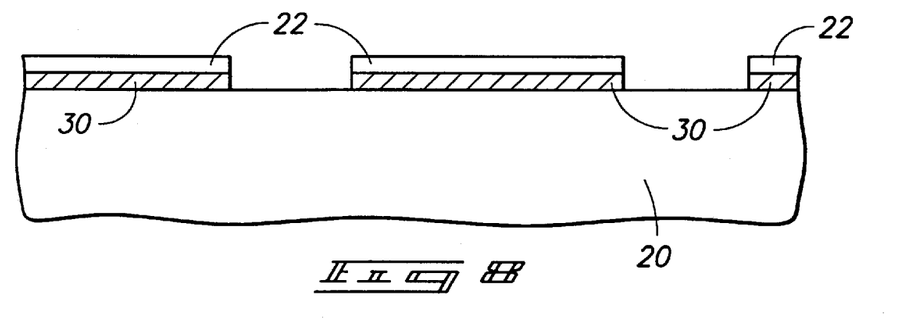
FIG. 8 is a view of the FIG. 6 wafer shown at a processing step subsequent to that of FIG. 7.

FIG. 8 shows that a pattern is transferred from photoresist 22 to conductive material 30. Such transfer can be accomplished by conventional methods, utilizing, for example, a $CCl_4$ or $CF_4$ etch if the conductive material comprises aluminum or tungsten.

Figure 9:
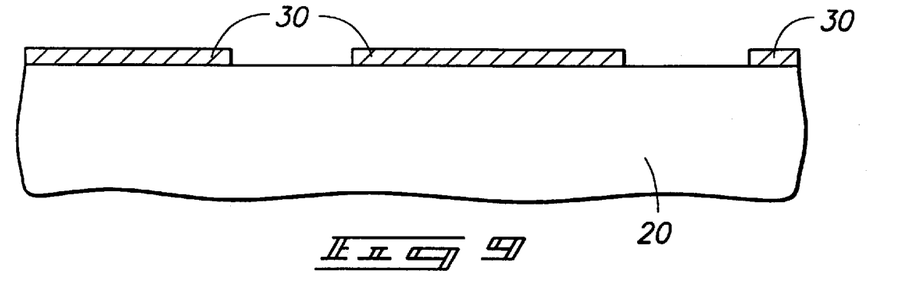
FIG. 9 is a view of the FIG. 6 wafer shown at a processing step subsequent to that of FIG. 8.

FIG. 9 shows photoresist material 22 stripped, to leave patterned conductive material 30 over wafer 20. Patterned conductive material 30 defines a first layer of circuitry on wafer 20.

Figure 10:
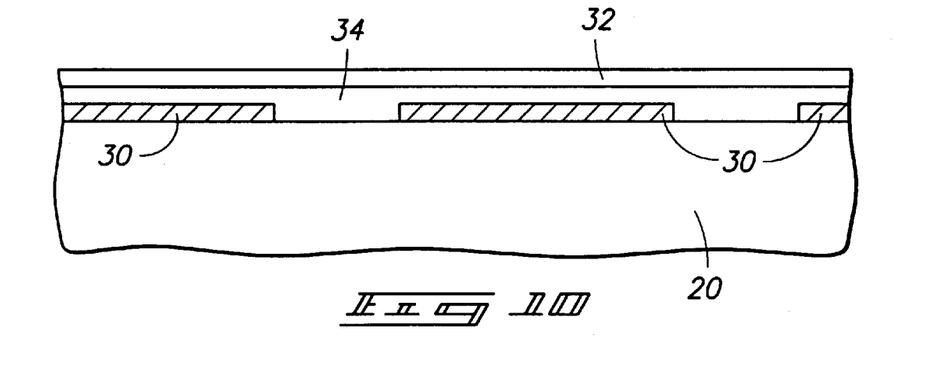
FIG. 10 is a view of the FIG. 6 wafer shown at a processing step subsequent to that of FIG. 9.

Referring to FIG. 10, an insulative material 34 and a second photoresist layer 32 are formed over wafer 20, as well as over conductive material 30. The wafer 20 having second photoresist layer 32 thereon is defined to be a second photoresist-coated wafer. Such second photoresist-coated wafer is preferably thermally equilibrated to the same temperature as was the first photoresist-coated wafer of FIG. 6. Such thermal equilibration can be accomplished by, for example, placing the second photoresist-coated wafer on a temperature-regulated mass, such as, for example, the mass 14 of FIGS. 1–5.

Figure 11:
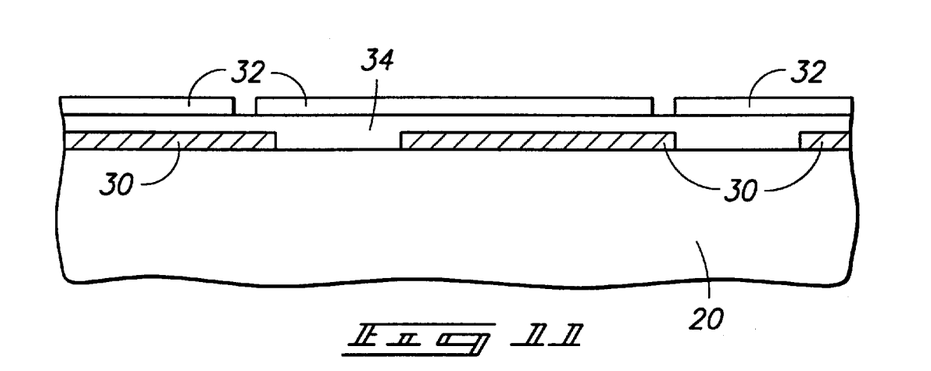
FIG. 11 is a view of the FIG. 6 wafer shown at a processing step subsequent to that of FIG. 10.

Referring to FIG. 11, the thermally equilibrated wafer 20 is exposed to photo-processing, and then to a solvent which selectively removes either portions of the photoresist exposed to light, or portions which were not exposed to light, to form the photoresist 32 into a patterned mask over insulative material 34 and conductive material 30.

Figure 12:
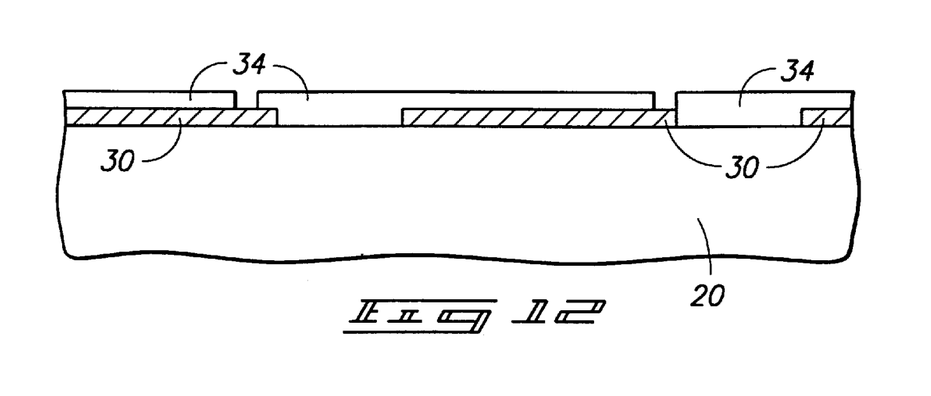
FIG. 12 is a view of the FIG. 6 wafer shown at a processing step subsequent to that of FIG. 11.

Referring to FIG. 12, a pattern is transferred from resist 32 (FIG. 11) to underlying insulative material 34, and subsequently resist 32 is removed.

Figure 13:
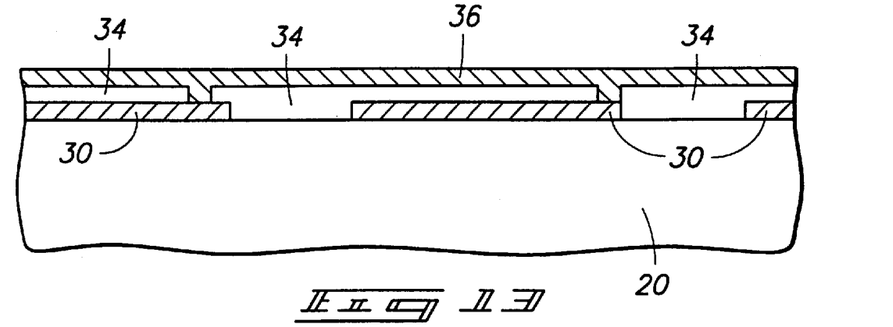
FIG. 13 is a view of the FIG. 6 wafer shown at a processing step subsequent to that of FIG. 12.

Referring to FIG. 13, a second conductive material layer 36 is formed over patterned insulative material 34 to form a second layer of circuitry over the first layer of circuitry defined by conductive material 30.

It is to be understood that the processing described above with reference to FIGS. 6–13 is exemplary to illustrate how a wafer could be thermally equilibrated to the same temperature at two photolithographic processing steps during fabrication of circuitry on the wafer. The particular choice of conductive and insulative materials is utilized for illustration purposes. Photoresist patterned according to a method of the present invention can, of course, be utilized for patterning of any materials (whether insulative, conductive, or semiconductive) in any order.

It is also to be understood that the photoresist layers are referred to as first and second photoresist layers herein and in the claims which follow to distinguish them from one another, and not to indicate any absolute ordering of the layers relative to other photoresist layers which may be formed. Accordingly, other photoresist layers can be formed before the so-called "first" photoresist layer, and can be formed in intervening process steps between the forming of the so-called "first" photoresist layer and the forming of the so-called "second" photoresist layer.

The thermally regulated mass 14 described above is utilized specifically for controlling and equilibrating a temperature of a semiconductive material wafer during photolithographic processing. Another application of a temperature-regulated mass is described with reference to FIGS. 14–16, which show fabrication of a reticle.

Figure 14:
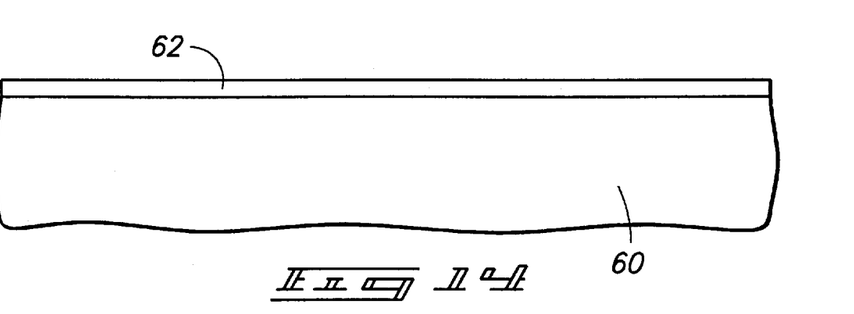
FIG. 14 is a diagrammatic, cross-sectional view of a reticle fragment at a preliminary step of a process of the present invention.

Referring to FIG. 14, a reticle substrate 60 is shown at a preliminary step of a fabrication process, and is shown having a masking layer 62 thereover. Reticle substrate 60 can comprise, for example, quartz, and the masking layer can comprise, for example, photoresist. An exemplary photoresist is a compound having relatively long molecular chains. Such long chains can be broken upon exposure to radiation to render any portions of the resist that were exposed to radiation more soluble in a solvent than are portions of the resist that were not exposed to the radiation. Another exemplary photoresist is a material configured such that exposure to radiation increases an acidity of exposed portions of the resist to make them more soluble in basic developer solutions. Both types of resist are conventional. Suitable photoresists include poly-(butene-1-sulfone) (PBS), 895I™ (available from ARCH Chemicals of Qunoset Point, R.I.) and IP3600™ (available from OHKA America).

Figure 15:
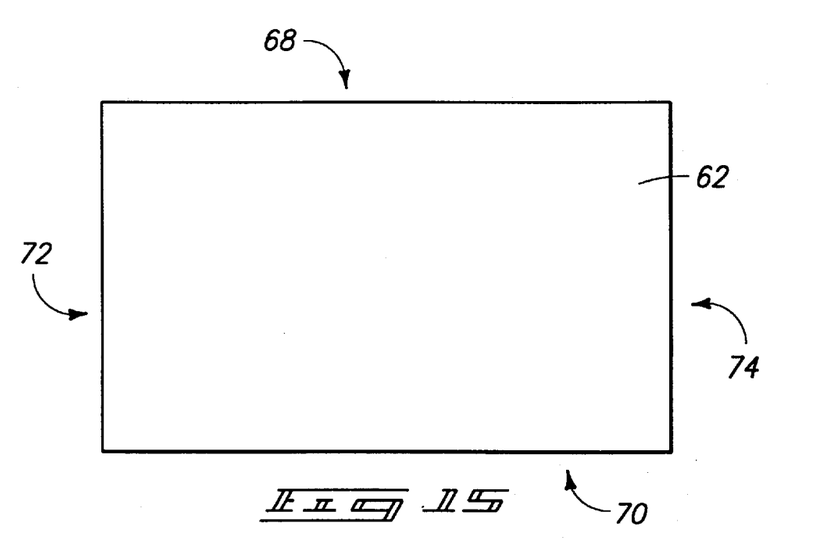
FIG. 15 is a top view of the reticle comprising the FIG. 14 fragment.

FIG. 15 shows a top view of a reticle comprising the FIG. 14 fragment, and specifically illustrates that reticle substrate 60 (FIG. 4) has a rectangular shape with opposing edges 68 and 70, and opposing ends 72 and 74. Generally, photoresist 62 is patterned by starting at one edge (68 or 70), and working across a top surface of photoresist 62 to the opposing edge. As discussed above in the "Background" section, such patterning can take hours, with laser beam patterning typically taking about eight hours, and electron beam patterning typically taking about 24 hours.

Figure 16:
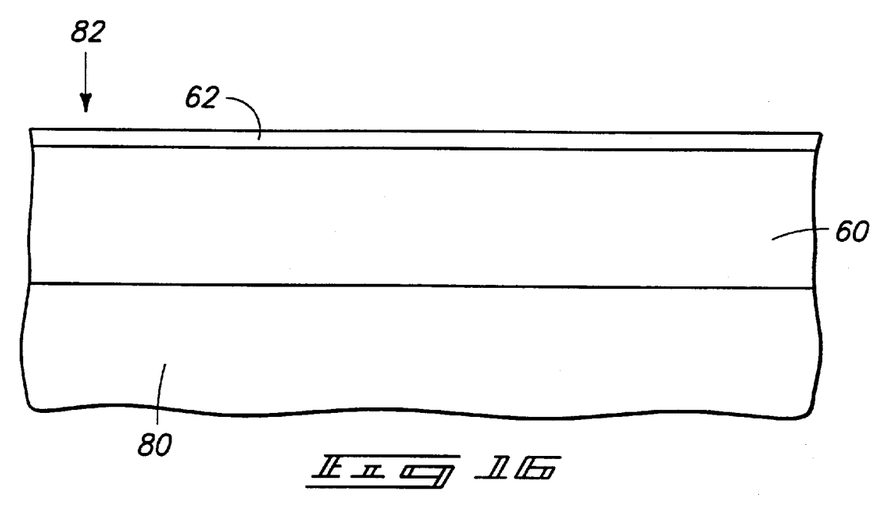
FIG. 16 is a diagrammatic, cross-sectional side view, corresponding to the same view as FIG. 14, and showing the reticle of FIG. 14 at a processing step subsequent to that of FIG. 14.

Referring to FIG. 16, reticle substrate 60 is shown provided on a temperature-regulated mass 80, and subsequently exposed to a radiation beam 82. In the shown embodiment, a bottom surface of substrate 60 physically contacts mass 80. Such physical contact can improve thermal transfer between mass 80 and substrate 60 relative to the transfer which would occur if mass 80 and substrate 60 were separated by another material, particularly if such other material were thermally insulative. The temperature-regulated mass preferably equilibrates substrate 60 to a temperature of from about 5° C. to about 15° C.

In accordance with one aspect of the invention, it is recognized that a mechanism for reducing non-uniformity of a pattern formed in photoresist 62 is to maintain substrate 60 at a constant temperature during exposure of resist 62 to beam 82. For instance, it is recognized that if radiation beam 82 cleaves molecules at one region of masking material 62 and then takes several hours to reach another region of mask material 62, the cleaved molecules at the first region can diffuse into neighboring portions of mask material 62 and reduce the sharpness within which a pattern is defined at the initial portion of 62. On the other hand, the portions of material 62 which are exposed last to radiation 82 will not have time to diffuse, and accordingly will remain relatively sharp. The reduction in sharpness at the initially exposed portions of material 62 relative to the sharpness remaining at later exposed portions of material 62 can cause non-uniformity in the development of a pattern in 62. Further, beam 82 can cause localized heating of exposed portions of material 62 which can further increase non-uniformity of pattern formation in material 62. Temperature-regulated mass 80 can alleviate some of the above-discussed problems by holding a temperature of reticle substrate 60 constant during exposure of material 62 to beam 82. If the constant temperature is kept relatively low, such will alleviate diffusion of molecules during the time that material 62 is exposed. Further, if an entirety of substrate 60 is held at a constant temperature, localized heating of portions of material 62 can be avoided, as can a general heating of material 62 which could otherwise occur during the time that the material is exposed to beam 82.

After the entirety of material 62 is appropriately exposed to beam 82, substrate 60 can be removed from mass 80, and material 62 exposed to solvent which selectively removes either the portions exposed to beam 82, or the portions not exposed to beam 82, to pattern material 62. A pattern from material 62 can then be transferred into reticle substrate 60 to pattern the reticle substrate. Subsequently, material 62 can be removed to leave a patterned reticle substrate 60. Such reticle substrate can then be utilized for patterning beams of light during photo-processing of photoresist.

Figure 17:
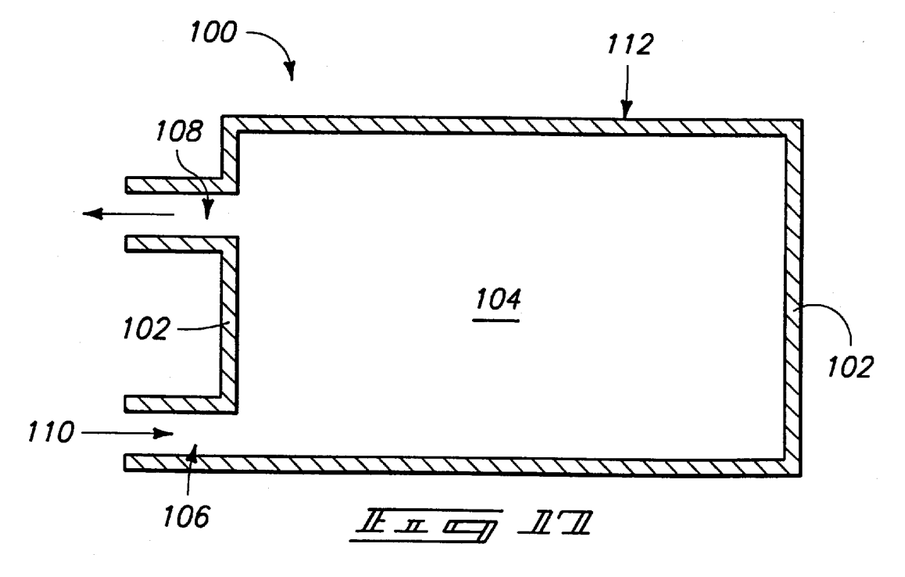
FIG. 17 is a diagrammatic, cross-sectional side view of a temperature-regulated mass encompassed by the present invention.

The temperature-regulated mass 80 of FIG. 16 can be constructed similarly to the temperature-regulated mask 14 of FIGS. 1–5. An exemplary temperature-regulated mass is shown in FIG. 17 as a mass 100. Mass 100 comprises a sidewall 102 configured to define a hollow cavity 104. Mass 100 further comprises a fluid inlet 106 and a fluid 8 outlet 108 configured to allow a fluid 110 to flow through cavity 104. Fluid 110 can comprise, for example, a liquid or gas, and can be temperature-controlled with a thermostat (not shown). The temperature-controlled fluid can be utilized to maintain a desired temperature of mass 100. Sidewall 102 preferably comprises a thermally conductive material, such as, for example, metal. Baffles (not shown) can be provided within cavity 104 to regulate fluid flow within the cavity.

Mass 100 comprises an upper surface 112 which can be considered to define a plate. Such plate is fluid-cooled by the flow of fluid 110 within cavity 104.

It is noted that the construction shown in FIG. 17 is an exemplary construction of a temperature-regulated mass, and that other constructions are encompassed by the present invention. For instance, another construction of a temperature-regulated mass is a coil. It is further noted that although the temperature-regulated masses 14 and 80 are shown as extending beneath an entirety of a wafer and reticle substrate, respectively, such masses could be configured to extend under only a portion of the wafer or reticle substrates in alternative embodiments.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming photoresist on a semiconductor wafer, comprising:
   coating the wafer with a first layer of photoresist, the wafer having the first layer of photoresist thereon being a first photoresist-coated wafer;
   placing the first photoresist-coated wafer on a temperature-regulated mass to thermally equilibrate the first photoresist-coated wafer to a temperature;
   after thermally equilibrating the first photoresist-coated wafer, photo-processing the first layer of photoresist;
   after photo-processing the first layer of photoresist, coating the wafer with a second layer of photoresist, the wafer having the second layer of photoresist thereon being a second photoresist-coated wafer;
   placing the second photoresist-coated wafer on the temperature-regulated mass to thermally equilibrate the second photoresist-coated wafer to the temperature; and
   after thermally equilibrating the second photoresist-coated wafer, photo-processing the second layer of photoresist.

2. The method of claim 1 wherein the temperature is from about 10° C. to about 30° C.

3. The method of claim 1 wherein the temperature is form about 18° C. to about 24° C.

4. The method of claim 1 wherein the temperature is from about 21° C. to about 23° C.

5. The method of claim 1 wherein the temperature-regulated mass is a fluid-cooled plate.

6. The method of claim 1 wherein a temperature of the temperature-regulated mass is thermal-electrically controlled.

7. A method of forming multiple layers of circuitry on a semiconductor wafer, comprising:
   coating the wafer with a first layer of photoresist, the wafer having the first layer of photoresist thereon being a first photoresist-coated wafer;
   placing the first photoresist-coated wafer on a temperature-regulated mass to equilibrate the first photoresist-coated wafer to a temperature;
   lifting the first photoresist-coated wafer from the mass and transferring the first photoresist-coated wafer to a photo-processing device;
   photo-processing the first layer of photoresist on the first photoresist-coated wafer to pattern the first layer of photoresist;
   utilizing the patterned first layer of photoresist to form a first layer of circuitry on the wafer;
   after forming the first layer of circuitry, coating the wafer with a second layer of photoresist, the wafer having the second layer of photoresist thereon being a second photoresist-coated wafer;
   placing the second photoresist-coated wafer on the temperature-regulated mass to equilibrate the second photoresist-coated wafer to the temperature;
   lifting the second photoresist-coated wafer from the mass and transferring the second photoresist-coated wafer to a photo-processing device;
   photo-processing the second layer of photoresist on the second photoresist-coated wafer to pattern the second layer of photoresist; and
   utilizing the patterned second layer of photoresist to form a second layer of circuitry on the wafer and over at least a portion of the first layer of circuitry.

8. The method of claim 7 wherein the temperature is from about 10° C. to about 30° C.

9. The method of claim 7 wherein the temperature is from about 18° C. to about 24° C.

10. The method of claim 7 wherein the temperature is from about 21° C. to about 23° C.

11. The method of claim 7 wherein the temperature-regulated mass is a fluid-cooled plate.

* * * * *

UNITED STATES PATENT AND TRADEMARK OFFICE
CERTIFICATE OF CORRECTION

PATENT NO. : 6,645,703 B2
DATED : November 11, 2003
INVENTOR(S) : Ziad R. Hatab et al.

It is certified that error appears in the above-identified patent and that said Letters Patent is hereby corrected as shown below:

<u>Column 7,</u>
Line 20, replace "100 further comprises a fluid inlet 106 and a fluid 8 outlet" with
-- 100 further comprises a fluid inlet 106 and a fluid outlet --

<u>Column 8,</u>
Line 12, replace "The method of claim 1 wherein the temperature is form" with -- The method of claim 1 wherein the temperature is from --

Signed and Sealed this

Eighth Day of June, 2004

JON W. DUDAS
*Acting Director of the United States Patent and Trademark Office*